United States Patent [19]

McClymonds

[11] Patent Number: 4,583,058
[45] Date of Patent: Apr. 15, 1986

[54] BROADBAND POWER COMBINER

[75] Inventor: James W. McClymonds, Waltham, Mass.

[73] Assignee: Raytheon Company, Lexington, Mass.

[21] Appl. No.: 766,090

[22] Filed: Aug. 16, 1985

Related U.S. Application Data

[63] Continuation of Ser. No. 553,927, Nov. 21, 1983.

[51] Int. Cl.$^4$ .............................................. H03B 5/00
[52] U.S. Cl. .................................. 331/107 P; 331/96; 331/56
[58] Field of Search ........... 331/56, 96, 107 P, 107 C, 331/107 DP

[56] References Cited

U.S. PATENT DOCUMENTS

| | | | |
|---|---|---|---|
| 3,628,171 | 12/1971 | Kurokawa et al. | 331/96 X |
| 3,739,298 | 6/1973 | Kawakami | 331/99 |
| 4,097,821 | 6/1978 | Lampen et al. | 331/101 |
| 4,172,240 | 10/1979 | Jerinic | 331/56 |

OTHER PUBLICATIONS

"Prototypes for Use in Broadbanding Reflection Amplifiers," W. J. Getsinger; IEEE Transactions on Microwave Theory and Techniques; Nov. 1963; pp. 436-497.
"A Device Characterization and Circuit Design Procedure for Realizing High-Power Millimeter-Wave IMPATT-Diode Amplifiers" by Dean F. Peterson, IEEE Transactions on Microwave Theory and Techniques, vol. MTT-21, No. 11, Nov. 1973, pp. 681-689.
"30/20 GHz Spacecraft Impatt Solid State Transmitter", Technical Proposal, Apr. 4, 1980, for NASA, RFP No. 3-188665-Q, by TRW Defense and Space Systems Group, Redondo Beach, Calif., pp. 3-16 to 3-31.
K. Kurokawa, "The Single Cavity Multiple Device Oscillator", IEEE Trans., 1971, MTT vol. 19, No. 10, pp. 793-801.
Y. C. Ngan, "Two Diode Power Combining Near 140 GHz", Electronics Letters, 1979, vol. 15, No. 13, pp. 376, 377.

Primary Examiner—Eugene R. LaRoche
Assistant Examiner—Robert J. Pascal
Attorney, Agent, or Firm—Denis G. Maloney; Richard M. Sharkansky

[57] ABSTRACT

A power combiner circuit for combining a plurality of signals to provide output power to a load over a broad range of operating frequencies includes a resonant cavity and a plurality of negative resistance diodes which couple such signals into the resonant cavity. Each one of the negative resistance diodes is disposed in a corresponding one of a like plurality of coaxial oscillators. In a first embodiment of the invention, the end of the cavity coupled to the load includes a plurality of members which provide a plurality of resonant structures and which are used to reduce variations in the impedance of the cavity over the operating range of frequency. In a second embodiment of the invention, each one of the coaxial oscillators includes a plurality of ring members used to match the impedance of the diode to that of the cavity and to reduce variations in the impedance of the cavity over the operating range of frequency. Since the impedance of the negative resistance diodes is a relatively slow changing function of frequency, reducing variations of the cavity impedance as a function of frequency provides a requisite impedance match between the diodes and the cavity over a broad range of operating frequency and, hence, provides high output power over such range of operating frequency.

11 Claims, 11 Drawing Figures

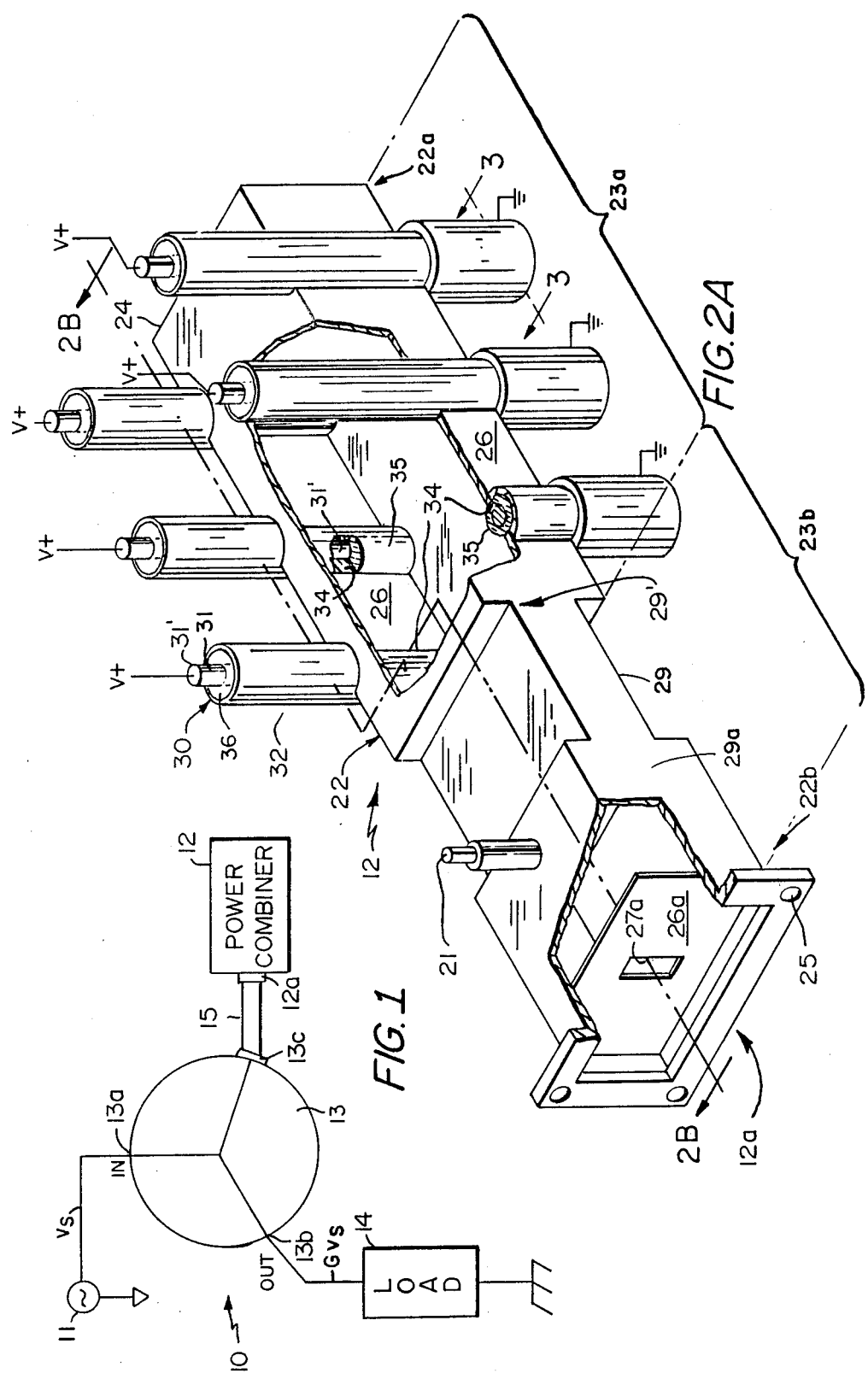

4,583,058

BROADBAND POWER COMBINER

The Government has rights in this invention pursuant to Contract No. F33615-80-1075 awarded by the Department of the Air Force.

This application is a continuation of application Ser. No. 553,927 filed Nov. 21, 1983.

BACKGROUND OF THE INVENTION

This invention relates generally to microwave circuits, and more particularly to microwave circuits for combining power from a plurality of negative resistance diode sources.

As is known in the art, a negative resistance diode, such as an IMPATT diode, is often used as an oscillator or an amplifier to convert DC power to radio frequency power. IMPATT diodes are often employed in radio frequency applications where very high output radio frequency power at very high frequencies and relatively high efficiencies is required. It is well known that the radio frequency signals provided from a plurality of IMPATT diode oscillators arranged in an appropriate manner may be combined together to provide a high power output signal, by being coupled to a common resonant cavity. As such, the IMPATT diode oscillators are positioned along the walls of the cavity to couple into the cavity equal portions of in-phase power to provide the high power output signal from the cavity. These types of resonant cavities used to combine output signals from a plurality of sources are commonly referred to as power combiners. One problem associated with use of IMPATT diodes in such power combiners to obtain such relatively high r.f. power is that when employed in such combiner circuits IMPATT diodes generally have a relatively narrow frequency bandwidth of operation. While in some applications this narrow bandwidth is tolerable and indeed sometimes desirable, in other applications a wider bandwidth for operation of the IMPATT diode is required.

SUMMARY OF THE INVENTION

In accordance with the present invention, a power combiner circuit for providing an output radio frequency signal over a broad range of operating frequency includes a resonant cavity, a plurality of diode oscillators which feed radio frequency signals into the cavity, and a matching circuit for reducing the variations in the impedance of the cavity over a predetermined range of frequency. In one embodiment, the matching circuit is provided to reduce variations in impedance of the cavity over a predetermined range of frequencies in order to provide a requisite impedance match between the cavity and the load. In an alternate embodiment, each one of the diode oscillators includes a plurality of matching elements arranged to reduce the variation in impedance of the cavity over a predetermined range of frequency in order to provide a requisite impedance match between each diode oscillator and the cavity. With such an arrangement, high output power over a relatively broad range of operating frequencies is provided.

BRIEF DESCRIPTION OF THE DRAWINGS

The foregoing features of this invention, as well as the invention itself, may be more fully understood from the following detailed description taken in conjunction with the accompanying drawings, in which:

FIG. 1 is a block diagram of a stable amplifier having a power combiner in accordance with the present invention;

FIG. 2A is a diagrammatical isometric view of the power combiner which is used in the stable amplifier of FIG. 1;

FIG. 2B is a cross-sectional view taken along line 2B—2B of the power combiner of FIG. 2A;

DESCRIPTION OF THE PREFERRED EMBODIMENTS

Figure 8:
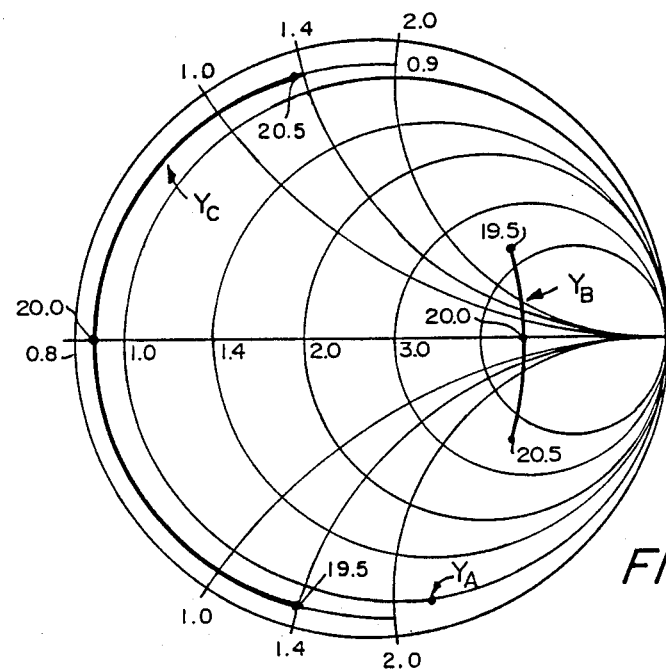
FIG. 8 is a plot useful in obtaining impedance values for the matching elements on a portion of a Smith chart.

Referring now to FIG. 1, a stable amplifier 10 is shown to include a power combiner 12 having an input-/output port 12a, and a circulator 13 having an input port 13a, an output port 13b, and a common port 13c. The common port 13c is connected to the input/output port 12a of power combiner 12, via a waveguide 15. The input port 13a is connected to an r.f. signal source which feeds r.f. energy into the circulator 13 and provides a signal which is to be amplified by the stable amplifier 10. The output port 13b is connected to a load 14 which is fed the amplified output signal from the power combiner 12. The stable amplifier 10 provides an amplified radio frequency signal to the load 14 in response to an input or injection signal ($v_s$) provided by a signal source 11 and fed to the power combiner 12. The injected signal $v_s$ is used to shift the operating point of the power combiner device line, and to produce in response thereto an amplified output radio frequency signal ($Gv_s$) at the input/output port 12a of power combiner 12 where G is the gain of the amplifier 10. Said amplified signal $Gv_s$ is fed to the circulator 13 and coupled to the output port 13b of the circulator 13 and hence to the load 14.

Referring now to FIGS. 2A and 2B, the power combiner 12 is shown to include here a rectangular waveguide body 22, having a first end portion 22a terminated by a plate 24, said plate 24 providing an r.f. short circuit, as is known in the art, and a second end portion 22b having a mounting flange 25, adaptable to interconnect the waveguide body 22 to the waveguide 15 (FIG. 1), thus providing the aforementioned input/output port 12a of power combiner 12. The rectangular waveguide body is preferably dimensioned to support the $TE_{10}$ mode of electromagnetic wave propagation over the desired range of operating frequencies. The power combiner 12 is shown to further include an impedance matching circuit 23b having a reduced height waveguide section 29 and a plate 26a having an aperture 27a. Here, matching circuit 23b provides a resonant structure having a relatively low external Q and a centerband response substantially at the centerband frequency of the power combiner, here 20 GHz. Reduced height waveguide section 29 has a selected electrical length $L_2$ typically between $\lambda_g/4$ and $\lambda_g/2$, here equal to $\lambda_g/4$ where $\lambda_g$ is the wavelength of the signal in the waveguide at the centerband frequency. A full height waveguide 29a is provided between plate 26a and reduced height section 29. The waveguide section 29a has a selected electrical length $L_3$ within the range of 0 to $\lambda_g/2$. In some applications, selecting $L_2 = \lambda_g/2$ and $L_3 \approx \lambda_g/16$ allows for easier mathematical modeling of the matching circuit 23b. A dielectric member 21 is disposed through an apertured port 21a centrally disposed through full height section 29a. Dielectric member 21 is provided to adjust the electrical length of full height member 29a. A resonant cavity 23a is formed between the back short plate 24 and end portion 29' of the reduced height waveguide 29. The height H and length $L_2$ of reduced height waveguide section 29, the size and shape of aperture 27a provided in plate 26a, and the length $L_3$ of full height section 29a which spaces plate 26a and reduced height waveguide section 29, are selected to provide the impedance matching circuit 23b with a predetermined external Q, $Q_x$, and a predetermined conductance g. The external Q and the conductance of the matching circuit 23b are selected to reduce variations in the impedance of the resonant cavity 23a over an extended, predetermined range of operating frequency, and thus, permit operation of the power combiner 12 over such extended, predetermined range of operating frequency, in a manner here to be described.

The power combiner 12 is shown to further include a plurality of diode oscillators 30. Each one of such diode oscillators 30 includes an inner conductor portion 31 centrally disposed within an outer shell conductor portion 32. Each diode oscillator 30 is disposed on wall portions 26 of the rectangular waveguide body 22, as shown. Intermediate ones of the diode oscillators 30 are spaced a distance $L_1$ here equal to $\lambda_g/2$ from adjacent ones of the diode oscillators 30. A first end one is spaced a distance L here equal to $\lambda_g/4$ from the back short plate 24, and a second end one is also spaced the distance L from the reduced height waveguide 29. Apertures 34 are provided through wall portions 26 of the waveguide body 22 and outer conductors 32 of each diode oscillator 30 to permit power to be coupled from the diode oscillators 30 to resonant cavity 23a. The inner conductor portion 31 of each one of the oscillators 30 is substantially centrally disposed through the apertures 34 provided in wall portions 26. The aperture 34 in the wall portion 26 of waveguide 22 is equal to the inner diameter of the outer shell conductor 32. Optionally, a sleeve 35 of Rexolite or any other low loss plastic dielectric material, is disposed over the center conductor 31, as shown. This sleeve 35 reduces the perturbation in the characteristic impedance of the coaxial transmission line caused by the missing portion of the outer conductor in the cavity. An upper end portion 31' of each one of said center or inner conductors 31 is coupled to a suitable direct current or pulsed direct current bias means (not shown), and a second end portion 31" of each one of the inner conductors 31 is connected to a negative resistance device 38, here an IMPATT diode.

Figure 3:
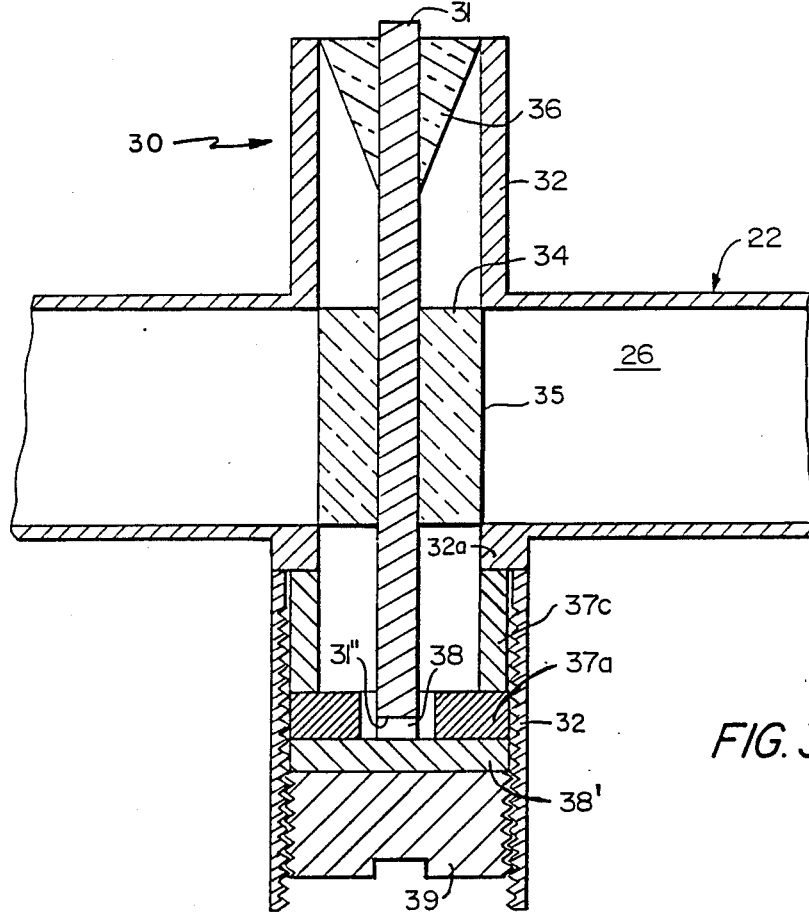
FIG. 3 is a vertical cross-sectional view taken along line 3—3 of a coaxial oscillator used in the power combiner of FIG. 2A.

Referring now to FIG. 3, an exemplary one of such diode oscillators 30 is shown to further include a tapered sleeve section 36, here comprising a lossy plastic material disposed around the upper end of the center conductor 31. The tapered sleeve section 36 is provided as a stabilizing load used to terminate the diode oscillators 30 in the characteristic impedance $Z_o$ of the transmission line provided by the combination of the outer conductor 32 and dielectrically spaced inner conductor 31. The diode oscillator 30 further includes a ring member 37a disposed around the center conductor 31, a spacer member 37c, and the IMPATT diode 38, as shown. A first end of IMPATT diode 38 is connected to the bottom end 31" of center conductor 31 and a second end of IMPATT diode 38 is connected to a portion of the outer conductor 32 by means of a heatsink portion 38' and a threaded member 39. The diode 38 is thus attached to end portion 31" of center conductor 31 with ring member 37a and spacer 37c aligned around center conductor 31. IMPATT diode ring member 37a and spacer 37c are provided in intimate contact with a wall portion 32a of outer conductor 32 by threaded member 39, as shown. In a like manner, remaining ones of coaxial oscillator section 30 are provided.

In operation, therefore, the frequency of the injection signal source $V_s$ is selected to be within the range of the locking frequency of the resonant structure 23a, as is known in the art, and the injection signal is introduced into resonant structures 23a, 23b through input/output port 12a. A continuous bias signal V+, for example, is applied to each of the diode oscillator sections 30, and in response to the bias signal and injection signal, a continuous wave (CW) r.f. signal is provided from each oscillator 30. The resulting signals from each oscillator 30 are then combined together in resonant structure 23a, and a portion of such combined signal is coupled through reduced height section 29 and apertured plate 26a to provide the high power output signal to load 14. It is to be noted that in response to the injection signal and the continuous bias signal, the power from the IMPATT diodes, coupled to the cavity 23a, is locked to the frequency determined by the injection signal. Each of such signals from each one of such diode oscillators 30 is then forced to resonate in-phase with each other at the resonant frequency determined by the injection signal. The power from each one of the diode oscillators 30 is thus combined in the cavity 23a.

Figure 4:
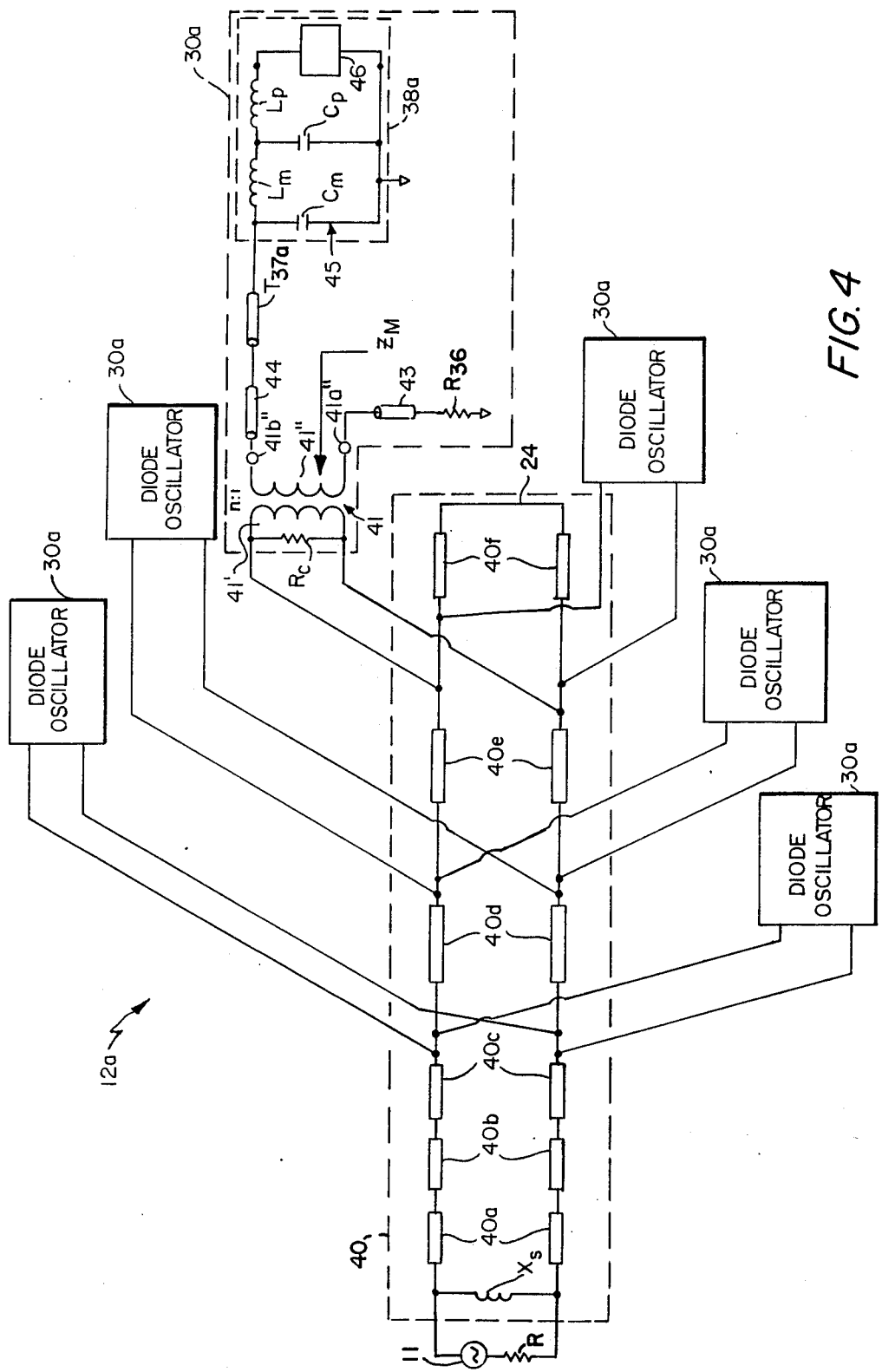
FIG. 4 is an equivalent circuit somewhat simplified of the power combiner of FIG. 2A.

Referring now to FIG. 4, an equivalent circuit 12a, somewhat simplified, for the power combiner 12 is shown to include an equivalent circuit 40 representative of the rectangular waveguide body section 22 (FIG. 2) here including a plurality of waveguide sections 40a–40f, each one of said waveguide sections 40a–40f being cascade interconnected together, as shown. A first end one of such waveguide sections 40a–40f, here waveguide section 40a, is coupled to a shunt reactance $X_s$ here representative of the apertured plate 26a, and a second end one, here waveguide section 40f, is terminated by the plate 24 providing the r.f. short circuit, as previously described. Waveguide section 40a here has the selected length $L_3$ between $\lambda_g/4$ and $\lambda_g/2$, and in combination with section 40b and reactance $X_s$ represent the equivalent circuit of the matching circuit 23b.

The equivalent circuit 30a for the coaxial section 30 here includes a transformer section 41 having a primary side 41' and a secondary side 41" thereof with such transformer having a turns ratio of n:1. The transformer section 41 represents the electrical equivalent for the coupling aperture 34 between waveguide body 22 and coaxial oscillator 30. Coupled in shunt with the primary side 41' of transformer section 41 is a resistor $R_c$, here representing wall losses in the cavity 23a. A first end 41a" of secondary side 41" is connected by a transmission line 43 having a characteristic impedance here equal to $Z_o$ terminated by a resistor $R_{36}$ here representative of the tapered sleeve 36 (FIG. 2). A second end 41b" of secondary side 41" is coupled to a second length of transmission line 44. Transmission line 44 here has a length approximately equal to $\lambda_o/2$ (half wavelength) where $\lambda_o$ is the wavelength of the corresponding nominal or centerband operating frequency $f_o$. The second end portion of transmission line 44 is connected to a serially-connected transmission line section $T_{37a}$ here representative of the ring member 37a which is disposed over the center conductor 31 of the coaxial oscillator 30, as previously described. The ring member 37a, here represented as a section of serially connected coaxial transmission line $T_{37a}$ is thus selected to represent the transmission line $T_{37a}$ having a selected length $L_{37a}$ and selected impedance $Z_{37a}$ to provide a requisite impedance transformation between the relatively low impedance of the IMPATT diode to the relatively high impedance of the cavity.

The second end of coaxial transmission line section is here shown connected to an equivalent circuit 38a, representative of IMPATT diode 38 and the region around IMPATT diode 38. The equivalent circuit 38a of IMPATT diode 38 here includes a network 45 having a shunt mounted capacitor $C_m$ here representing the parasitic mount capacitance of the diode, a series connected inductor $L_m$ representing the parasitic mount inductance, a second capacitor $C_p$, here representing the parasitic capacitance of the diode package mounted in shunt between inductor $L_m$ and ground, and a second series inductor $L_p$, here representing parasitic inductance of the diode package connected between inductor $L_m$ and an IMPATT diode chip 46. A first terminal of the IMPATT diode chip 46 is electrically connected to the outer conductor 32 and hence to a suitable reference potential such as ground. In a like manner, each one of said remaining diode oscillators 30 have similar equivalent circuits, here represented by blocks 30a.

As is known in the art, each one of the diode oscillators 30 is positioned along points of the waveguide body 22 at magnetic field maxima in the Z-direction to insure adequate coupling between each one of the oscillators 30 and the resonant structure or cavity 23a. At the resonant frequency of the cavity 23a determined by the dimensions of the waveguide body, as is known in the art, the cavity 23a causes a large perturbation in the impedance Z seen by the combination of the IMPATT diode 38 and annular member 37a here providing the impedance matching member $T_{37a}$ (FIG. 4). This large perturbation or disruption in impedance in combination with an injection signal $V_s$ provides the resonance condition which matches the diode impedance to the impedance of the cavity, causing amplification of such signal at the resonant frequency. Each one of such diodes provides an equal portion of in-phase power to cavity 23a. The power coupled to the cavity 23a from each one of such diodes is then coupled through cavity 23b to the external load 14.

In conventional power combiners, the midplane impedance of the cavity, that is, $Z_m$ the impedance seen looking toward the cavity from the IMPATT diode, is a relatively fast changing or strong function of frequency. That is, over a relatively broad range of frequencies, here from 19.6 GHz to 20.6 GHz, a relatively wide variation in the impedance of such cavity is provided. On the other hand, as is also known in the art, the impedance of the diode is a relatively weak function of frequency. Therefore, since the impedance of the cavity is a relatively strong function of frequency and the impedance of the diode is a relatively weak function of frequency, there is a very limited frequency range over which the cavity impedance will be matched with the diode impedance to thereby provide amplification of a radio frequency signal.

Figure 5:
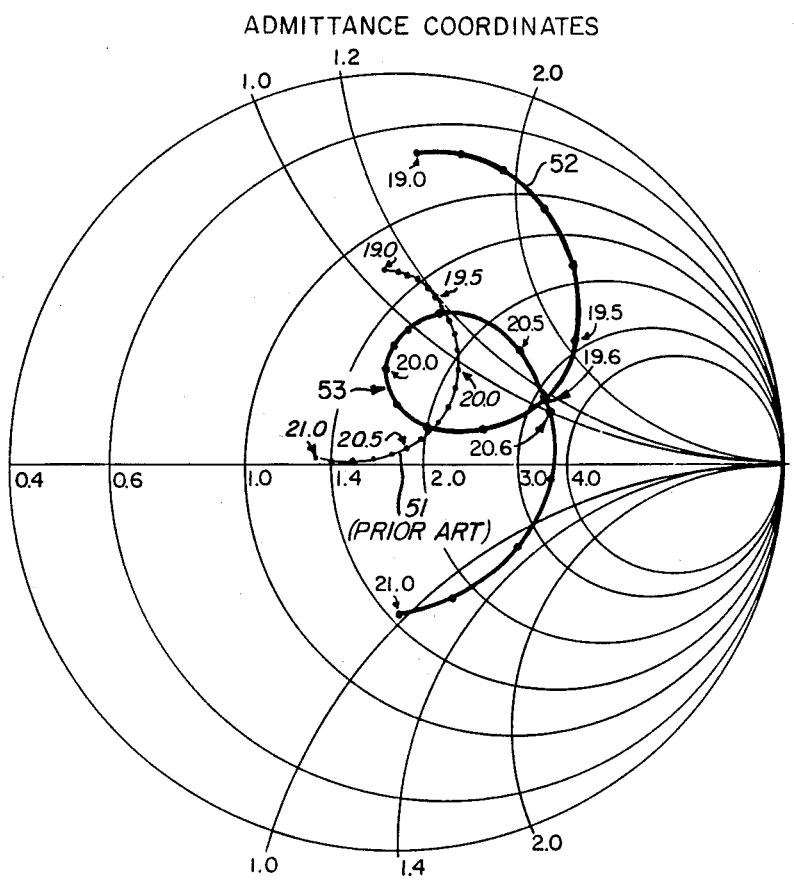
FIG. 5 is a plot of the variation of impedance with frequency of a typical prior art power combiner, and the power combiner of FIG. 2A on a portion of a Smith chart.

With the foregoing in mind, a plot of the normalized impedance of a conventional cavity is typically similar to that shown in FIG. 5, curve 51. As curve 51 of FIG. 5 depicts for a typical power combiner employing solely an apertured plate and a single matching transformer, the impedance of the cavity as seen from the diode network is a relatively fast changing or strong function of frequency having a relatively large change in impedance over the frequency range of 19.6 to 20.6 GHz.

Figure 6:
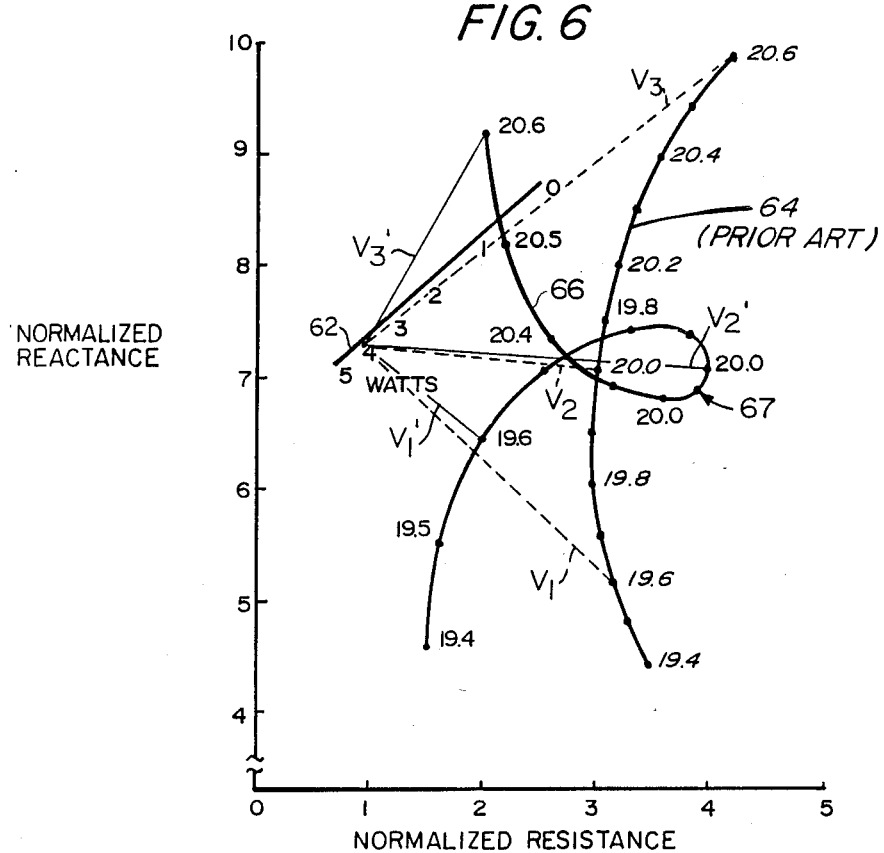
FIG. 6 is a plot of the variation of impedance with respect to frequency of an IMPATT diode, a typical prior art power combiner, and the power combiner of FIG. 2A on a complex impedance plane.
Figure 7:
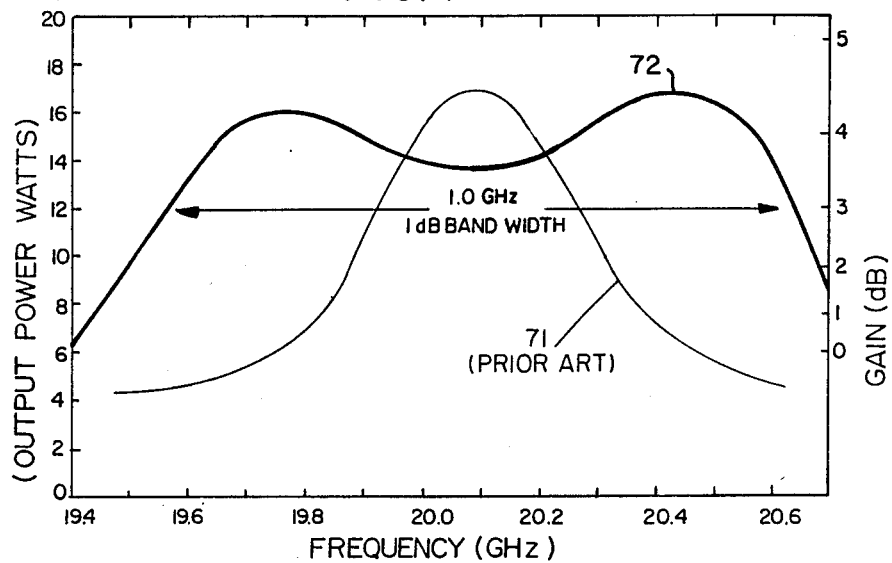
FIG. 7 is a plot of output power vs. frequency for a typical power combiner of the prior art and the power combiner of FIG. 2A.

Further as shown in FIG. 6, a plot of load reactance and load resistance for a typical diode chip is represented by device line 62, and that for a conventional power combiner circuit is here represented by loadline 64. The stable amplifier has an operating point determined by a vector drawn between the frequency point on the cavity loadline and a point on the device loadline for the same frequency. Such a vector is a pictorial representation of the magnitude and phase angle of the required input signal for the stable amplifier to provide a predetermined output signal. Since the diode impedance is a relatively weak function of frequency, the impedance variation of the IMPATT diode chip with frequency is here ignored. Thus, the diode impedance as a function of all frequencies within the band of 19.6 to 20.6 GHz, for example, is here represented by the single device line 62. As shown in FIG. 6, the length as well as direction of the locking vectors $V_1$–$V_3$ have a relatively wide range of variation over the frequency range of 19.6 to 20.6 GHz with the shortest locking vector $V_2$ and hence highest gain occurring at 20 GHz. In operation of a conventional stable amplifier, therefore, the gain would, as shown in FIG. 7, curve 71 be a maxima at the centerband frequency here 20 GHz, and would quickly decline while approaching 19.6 and 20.6 GHz as the cavity impedance changed with frequency, as shown in FIG. 5 and FIG. 6. Thus, the conventional stable amplifier employing a power combiner where the cavity impedance is a relatively fast or strong function of frequency is generally a narrowband device.

A stable amplifier will have a relatively broad bandwidth if the cavity loadline is not a rapidly changing or strong function of frequency, so that the distance between the cavity loadline and the point of the device line or hence the length of the locking vector is roughly constant from the high power region of the device line to any point on the cavity loadline in the operating band.

Therefore, in accordance with the invention, the power combiner 12 is modified such that the cavity 23a midplane impedance $Z_m$ is a relatively weak or slow changing function of frequency thereby providing the requisite, conjugate match of the cavity impedance $Z_m$ to the impedance of the IMPATT diodes over a relatively wide band of operating frequencies. A first technique for providing operation over a relatively wide band of frequency is to match the impedance of the cavity to the impedance of the external load over such a range of operating frequency by providing a suitable impedance matching circuit between the cavity and the external load. One embodiment of the impedance matching circuit includes the reduced height waveguide 29 and the apertured plate 26a coupled to the rectangular waveguide 22 between the external load and the last one of the diode oscillators of the power combiner, as shown in FIGS. 2A, 2B. By providing the plate 26a, and reduced height waveguide 29, the second resonating structure 23b in combination with the first resonating structure or cavity 23a, reduces the variation in impedance with frequency of the cavity midplane impedance $Z_m$ of cavity 23a and hence the power combiner 12. The size and shape of the aperture 27a in plate 26a, the height of the waveguide 29, length of waveguide 29 and the spacing between waveguide 29 and plate 26a are selected to provide a resonant structure or matching circuit having a predetermined $Q_x$ and g to provide reduced or compacted variations in the overall impedance of the cavity 23a as a function of frequency. Here such members are selected to provide a 20 Gigahertz resonator having a relatively low external Q.

Thus, as shown in FIG. 5, a plot of the midplane impedance $Z_m$ of the cavity 23a including the broadband matching network, i.e. the apertured plate 26a and reduced height waveguide 29 is shown as curve 52. It is to be noted that over the frequency range of 19.6 GHz to 20.6 GHz, the impedance characteristic for cavity 23a is a relatively weak or slow changing function of frequency. The midplane impedance of the power combiner 12 as a function of frequency between 19.6 and 20.6 GHz is relatively compact in impedance range. The impedance matching circuit (i.e. resonant structure 23b) thus modifies the cavity midplane impedance $Z_m$ such that the impedance $Z_m$ has a loop 53 which is characteristic of a double-tuned response, and thus provides a relatively compressed range of impedance values over the predetermined frequency range. The loop 53 in the impedance of the cavity has the effect of reducing the range of variation in the cavity midplane impedance and thereby provides a cavity midplane impedance which is a relatively slow changing or weak function of frequency over the selected range of 19.6 to 20.6 GHz.

Thus, as shown in FIG. 6, the plot of the cavity loadline for power combiner 12 (curve 66) likewise depicts a relatively slow changing weak function of frequency for the impedance of the cavity with broadband matching between the load and the cavity. As shown in FIG. 6, the lengths of locking vectors $V_1'-V_3'$ here representative of the injection signal $V_s$ required at 19.6, 20 and 20.6 GHz, are relatively more uniform than the lengths associated with locking vectors $V_1-V_3$ for curve 64. A loop 67 in the loadline impedance characteristic 66 is a result of the double-tuned response of the power combiner 12 provided by the broadband matching network or resonant structure 23b described above. Such an impedance characteristic reduces the variations in the lengths required of the locking vectors $V_1'-V_3'$, and hence, reduces variations in the required input signal fed to the stable amplifier 10 thereby providing extended broadband performance.

As shown in FIG. 7, the 1 dB bandwidth (curve 72) of the stable amplifier 10 fabricated in accordance with the present invention was 1 GHz, whereas the bandwidth (curve 71) for a typical centerband power combiner is substantially less. In addition, as depicted in FIG. 7, curve 72 has a double-tuned, double-hump response which is characteristic of a pair of cavities having a coupling coefficient equal to or less than a critical coupling coefficient of the pair of resonating structures 23a, 23b, as is known in the art.

The IMPATT diode used to obtain the response shown as curve 72 was a double drift read-type diode, having an average output power of 4.6 Watts and average efficiency of 20%, at a centerband frequency of 20 GHz, and at an average junction temperature of 200° C. However, any IMPATT diode suitably matched and biased will give corresponding results. The matching elements, that is, the reduced height waveguide 29 and apertured plate 26a were chosen to reduce the frequency dependence of the impedance of cavity 23a, as seen by the diode chip. The apertured plate 26a was selected to have a substantially vertical opening of width d characteristic of an inductive iris and is thus shown in FIG. 4 as a shunt inductor. Therefore, as shown in FIG. 8, the admittance of the iris 26a and matched load (circulator 13) are represented as a point of admittance $Y_a$. This admittance $Y_a$ is substantially constant over the frequency range of operation. The length $L_3$ (between $\lambda_g/4$ and $\lambda_g/2$) of the full height waveguide section 29a is chosen to provide, in combination with admittance $Y_a$, an admittance $Y_b$ which is on the real axis of the graph at 20 GHz, as shown in FIG. 8. The dielectric tuner is provided to fine tune the electrical length of the waveguide section 29a. Further, admittance $Y_b$ is selected to have an arc in impedance characteristic over the operating frequency range because the angle of rotation (i.e. the arc) of $Y_b$ is proportional to frequency. The quarter wavelength ($\lambda_g/4$) reduced height section 29 is therefore used to transform the admittance $Y_b$ into an admittance $Y_c$. Over the frequency band of interest admittance $Y_c$ follows a constant conductance (g) contour and has a characteristic susceptance b which varies linearly with frequency. Therefore, the waveguide matching structure 23b together with the matched load of the circulator may be accurately modelled as a parallel resonant circuit with a normalized conductance $g_o$ and an external Q, $Q_x$, given by $Q_x = (F_o/2)/(\Delta b/\Delta F_o)$ where $F_o$ is the resonant frequency, $\Delta F_o$ is a deviation from the resonant frequency and $\Delta b$ is a deviation from the susceptance of the resonant circuit at $F_o$. From the foregoing, one of skill in the art can choose the height of waveguide 29, the size and shape of aperture 26a and distance $L_3$ to provide the requisite impedance match between the matched load (circulator 13 and load 14) and the resonant structure 23a.

Figure 9:
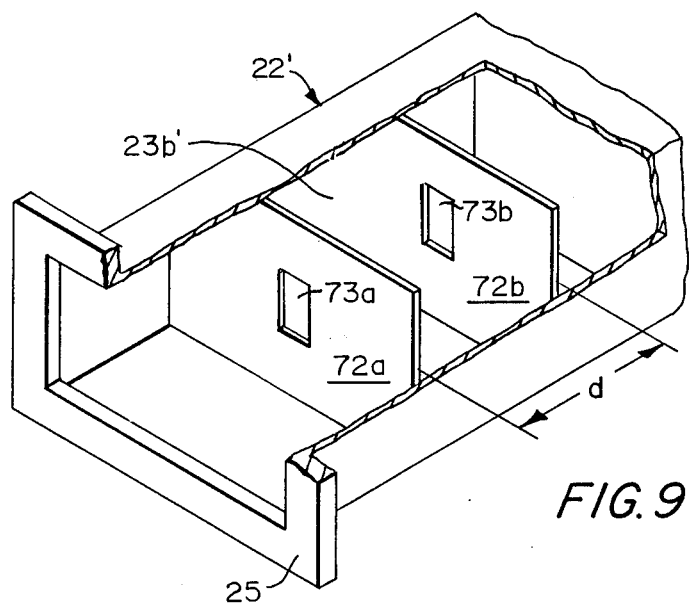
FIGS. 9, 10 are sectional diagrammatical isometric views of alternate embodiments of matching networks of the power combiner.

An alternate embodiment of the power combiner 12' is shown in FIG. 9 to include here a plurality of apertured conductive plates 72a, 72b, each having an aperture 73a, 73b, respectively. The apertured plates are spaced a selected distance d in a waveguide 22'. In other aspects, the embodiment of FIG. 9 is equivalent to that of FIG. 2A with the size and shape of apertured plates and spacing d being selected to provide a resonating structure 23b' which is used to reduce variations in impedance of cavity 23a in a similar manner, as previously described.

Figure 10:
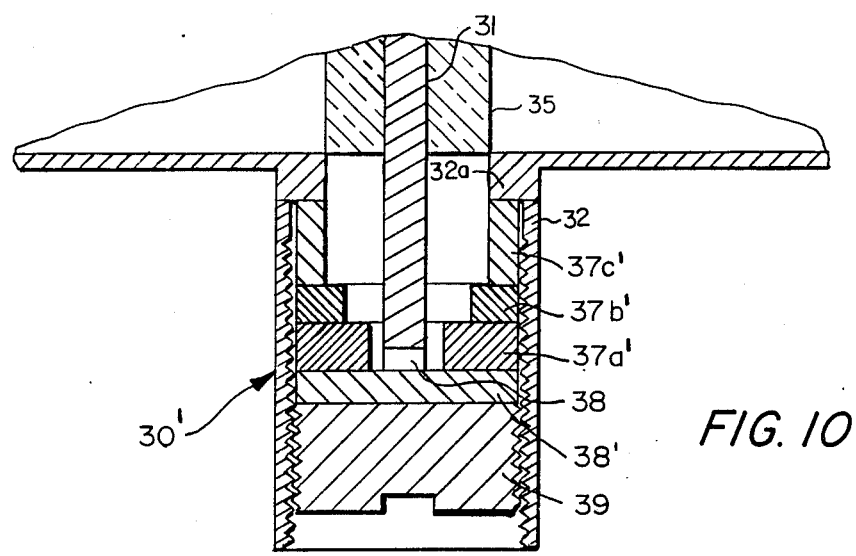

An alternate embodiment of the diode oscillators 30' is shown in FIG. 10. Each diode oscillator 30' includes a plurality of ring members 37a', 37b' and a spacer 37c', as shown. The plurality of ring members 37a', 37b' having selected inner diameters $d_{37a'}$, $d_{37b'}$, respectively, are used to reduce variations of the impedance of the cavity with respect to frequency in a similar manner, as previously described, and thus can be used to provide an optimum match between the impedance of the diode and the impedance of the cavity over a predetermined frequency range. The inner diameters $d_{37a'}$, $d_{37b'}$ are selected to provide a relatively small volume around the IMPATT diode 38. This in turn decreases the equivalent mount inductance $L_m$ (FIG. 4) and facilitates impedance matching to the IMPATT diode 38.

Further, either of the two previously mentioned techniques for matching the impedance of the cavity to that of the load, and the technique for matching the impedance of the cavity to the diode over the operating range of frequency when used in combination provide a triple-tuned response, wherein the impedance characteristic loops again, within itself, providing a more compacted impedance characteristic as a function of frequency. It is thus believed that this arrangement where each one of the matching elements are chosen to provide selected impedance characteristics, in a manner as previously described, will provide a power combiner which operates over a relatively wide band of frequency.

Having described preferred embodiments of the invention, it will now be apparent to one of skill in the art that other embodiments incorporating its concept may be used. It is felt, therefore, that this invention should not be limited to the disclosed embodiments, but rather should be limited only by the spirit and scope of the appended claims.

What is claimed is:

1. A power combiner for combining a plurality of radio frequency signals into a combined output signal comprising:

first means, comprising a resonant cavity having an impedance which varies over a predetermined range as a function of frequency over a predetermined band of operating frequency, and a plurality of diodes adapted for coupling to a bias energy source and coupled to the cavity for converting the energy of said bias source into the plurality of radio frequency signals and for combining said signals into a composite signal; and second means, coupled between the resonant cavity and an output port of the power combiner, said second means having an impedance which varies substantially oppositely with the impedance of the cavity over the predetermined band of operating frequency, for reducing the range of variation in the impedance of the resonant cavity over the predetermined range of operating frequency of the cavity and for providing the combined output signal to the output port.

2. The power combiner as recited in claim 1 wherein the second means for reducing the variation in the range of impedance of the cavity comprises:
   a first waveguide;
   a plate having an aperture;
   a second waveguide coupled between the first waveguide and the plate; and
   wherein one of said first waveguide and plate is coupled to the cavity resonator.

3. The power combiner as recited in claim 2 wherein the height and length of the first waveguide, the size and shape of the aperture provided in the plate, and the length of the second waveguide are selected to provide the reduced variation in the range of the impedance of the cavity.

4. The power combiner as recited in claim 1 wherein the second means comprises:
   a plurality of plates spaced apart a selected distance, each plate having an aperture of a selected size and shape.

5. The power combiner as recited in claim 1 further comprising:
   third means, disposed between each one of the diodes and the cavity resonator, for matching an impedance characteristic of the cavity resonator to an impedance characteristic of each one of said diodes.

6. The power combiner as recited in claim 5 wherein the third matching means comprises a plurality of ring members disposed adjacent each one of the diodes, each ring member having an inner diameter selected to provide the impedance match between the cavity resonator and each one of said diodes.

7. A power combiner for combining a plurality of radio frequency signals into a combined signal comprising:
   a cavity resonator comprising a rectangular waveguide having a short-circuited first end and an opposing second end;
   a plurality of diode oscillators positioned along wall portions of the rectangular waveguide, each one of said diode oscillators further comprising:
   (i) an outer conductor;
   (ii) an inner conductor dielectrically spaced within said outer conductor;
   (iii) a negative resistance diode having a pair of contacts connected between said conductors; and
   (iv) a plurality of conductive members disposed around said inner conductor;
   means, coupled to the cavity resonator and an output of the power combiner for matching the impedance characteristic of said cavity resonator to the impedance characteristic of a load over a predetermined range of operating frequency.

8. The power combiner as recited in claim 7 wherein the conductive members have an inner diameter selected to provide the impedance match.

9. The power combiner as recited in claim 7 wherein the means for matching comprises:
   a second rectangular waveguide;
   a plate having an aperture;
   a third rectangular waveguide; and
   wherein one of said second waveguide and said plate is coupled to the cavity to provide a coupling member for the cavity, and the third waveguide is coupled between the plate and the second waveguide.

10. The power combiner as recited in claim 9 wherein the height and length of the second waveguide, the size and shape of the aperture provided in the plate, and the length of the third waveguide are selected to provide the impedance match.

11. The power combiner as recited in claim 7 wherein the matching means comprises:
    a plurality of plates, each plate having an aperture and spaced apart a predetermined distance.

* * * * *